United States Patent
Chen (10) Patent No.: US 7,580,280 B2
(45) Date of Patent: Aug. 25, 2009

(54) METHOD AND APPARATUS FOR A NON-VOLATILE MEMORY DEVICE WITH REDUCED PROGRAM DISTURB

(75) Inventor: Chung-Kuang Chen, Pan Chiao (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 11/862,903

(22) Filed: Sep. 27, 2007

(65) Prior Publication Data

US 2008/0055980 A1    Mar. 6, 2008

Related U.S. Application Data

(62) Division of application No. 11/370,368, filed on Mar. 8, 2006, now Pat. No. 7,313,018.

(51) Int. Cl.
    *G11C 16/24*    (2006.01)
(52) U.S. Cl. .............. 365/185.02; 365/185.18; 365/185.25
(58) Field of Classification Search ............. 365/185.02
    See application file for complete search history.

(56) References Cited

U.S. PATENT DOCUMENTS

| | | | |
|---|---|---|---|
| 5,280,446 A * | 1/1994 | Ma et al. ............... | 365/185.15 |
| 5,297,098 A | 3/1994 | Nakatani et al. | |
| 5,790,456 A | 8/1998 | Haddad | |
| 5,798,966 A | 8/1998 | Keeney | |
| 5,850,091 A * | 12/1998 | Li et al. .................. | 257/316 |
| 6,005,809 A | 12/1999 | Sung et al. | |
| 6,108,240 A | 8/2000 | Lavi et al. | |
| 6,118,695 A | 9/2000 | Yoneyama | |
| 6,175,519 B1 | 1/2001 | Lu | |
| 6,181,599 B1 | 1/2001 | Gongwer | |
| 6,337,245 B1 * | 1/2002 | Choi ...................... | 438/258 |
| 6,660,585 B1 * | 12/2003 | Lee et al. ............... | 438/257 |
| 7,079,426 B2 | 7/2006 | Zhang et al. | |

* cited by examiner

*Primary Examiner*—Tan T. Nguyen
(74) *Attorney, Agent, or Firm*—Baker & McKenzie LLP (57) ABSTRACT

A non-volatile memory device includes a plurality of power control circuits interfaced via a single Y multiplexer with an array of memory cells. The multiple power control circuits provide multiple pre-charge paths configured to pre-charge the drain node of a target memory cell in the array, as well as the drain and/or source nodes of unselected memory cells in the array. The multiple pre-charge paths decrease the current through the array cells and also decrease the pre-charge and set up times for the array.

18 Claims, 8 Drawing Sheets

METHOD AND APPARATUS FOR A NON-VOLATILE MEMORY DEVICE WITH REDUCED PROGRAM DISTURB

RELATED APPLICATION AND PRIORITY CLAIM

This application is a Divisional Application of U.S. patent application Ser. No. 11/370,368, entitled "Methods and Apparatus for Non-Volatile Memory Device with Reduced Program Disturb" filed Mar. 8, 2006, which is herein incorporated by reference in its entirety for all purposes.

FIELD OF THE INVENTION

The embodiments described below generally relate to non-volatile memory devices, and more particularly to reducing the disturbance of threshold voltages when programming such non-volatile memory devices.

BACKGROUND OF THE INVENTION

Non-volatile memory devices, such as EPROMs, EEPROMs, and flash memory devices use a threshold Vt of a memory cell to indicate a data value stored in the memory cell. When writing, or programming, a target memory cell, programming voltages are applied to the cell via a word line connected to a control gate of the selected cell, a bit line connected to a drain of the selected cell, and a source line coupled with the source of the selected cell. The combination of programming voltages changes the threshold voltage of the target cell, e.g., by causing Fowler-Nordheim (FN) tunneling or by Channel Hot Electron (CHE) injection of charge into, or out of a floating gate in the selected memory cell.

For example, for CHE injection in a target memory cell, e.g., containing a typical N-channel floating gate transistor, a high voltage is applied to the control gate, a high voltage is applied to the drain, and a low voltage is applied to the source. This combination of voltages creates a large lateral electric field between the source and drain, which generates hot electrons that are injected into the floating gate thereby increasing the threshold voltage level of the floating gate with respect to the control gate. By adjusting the magnitude and/or duration of the programming voltage applied to the control gate, this target cell can be programmed to a desired threshold Vt.

Conventionally, hot electron programming is performed by first ramping up the drain voltage, or the gate voltage. In other words, a low voltage is first applied to the source, and then the drain voltage is increased. Once the drain voltage has reached its target level, the gate voltage can be applied. In other embodiments, the gate voltage can be ramped and then the drain voltage can be applied. Accordingly, there is typically a drain voltage set up time involved with programming a non-volatile memory device.

During programming of a target memory cell, the voltages applied to the drain and a high voltage applied to the control gate for the target memory cell can cause two types of disturbances: (1) create a large voltage difference between the floating gate and drain of unselected memory cells that are connected with different word line but the same drain bit line. This unintended voltage difference between the floating gate and drain of unselected memory cells can induce FN tunneling of electrons into or out of the floating gate, which can disturb the threshold voltages of these unselected memory cells. And (2) create a large CHE current to pre-charge the parasitic array loading through the unselected memory cells connected with the same word line. These two kinds of disturbances of the threshold voltage are often referred to as a program disturb effect.

The FN tunneling current (number (1) above) is exponentially dependent on the electric field in the gate oxide between the bit line coupled with the drain and the floating gate, program disturb will worsen significantly even for small increases in the electric field. If the FN tunneling current is high enough for a long enough period, the threshold voltages of the unselected cells can be lowered significantly, thereby adversely affecting the accuracy of the storage array. If the CHE current created in the unselected cells (number (2) above) is high for a long enough period, the threshold voltage of the unselected cells can be raised significantly, thereby adversely affecting the accuracy of the storage array, especially for multi-level cell (MLC) memory.

Further, the disturbance of threshold voltages can accumulate through repeated programming of memory cells in the same column or row and change the data value stored in unselected cells. Depending on the memory a data value stored in a memory cell can be binary, e.g., a "1" or a "0," multilevel, e.g., the cell can be programmed to a value from a set of discreet values, or analog, e.g., the cell can be programmed to a value within a continuous range of possible values. For binary memories, the accumulated disturbance of threshold voltages must be relatively large, on the order of a volt or more, in order to change the threshold voltage from a state indicating a first binary value to a state indicating the second binary value; however, for multilevel or analog memories, distinguishable threshold voltage differences for data values can be a few millivolts. Accordingly, even small differences in threshold voltages can result in program disturb.

For multilevel and analog memories, the problem is only getting worse as the channel lengths for conventional devices get shorter and shorter. Accordingly, program disturb is becoming a larger issue as non-volatile memory devices evolve.

The total accumulative disturb due to number (1) above is dependent on the number of cells on a bit line, the right time of a cell, the area in gate oxide thicknesses between the drain and the floating gate, and the drain voltage applied for programming. Thus, program disturb can limit, among other things, the number of cells that are allowed on a single bit line, as well as the thickness of the gate dielectric of the memory cells.

Accordingly, one approach to limiting, or preventing program disturb is to divide larger arrays into several smaller arrays so that fewer memory cells are on the same row or column. In such devices, programming a selected memory cell disturbs fewer unselected memory cells, and the accumulated programming disturb time for each memory cell is reduced; however, including more small arrays has the unwanted effect of increasing the overhead in decoding circuitry required to access the memory cells. This increased overhead results in increased cost and size of the memories.

The total accumulative disturb due to number (2) above is dependent on the number of program shots of the selected cells on the same word lines. Conventional approaches for limiting the pre-charge parasitic loading current involve pre-charging all the parasitic array loading. Other conventional solutions include pre-charging the drain, and in some instances the source nodes of unselected memory cells in order to prevent the program disturb effect. Such solutions, however, increase the pre-charge and set up times and therefore increase the overall programming time. Such solutions also tend to increase power consumption during programming, which can reduce battery lifetimes in portable devices.

Other solutions to the program disturb problem involve applying varying biases to the gates of unselected cells. But as with solutions that pre-charge the drain and/or source nodes of unselected cells, applying variable biases to the gates can increase pre-charge and set up times and can increase the overall power consumption.

SUMMARY

A non-volatile memory device includes a plurality of power control circuits interfaced via a single Y multiplexer with an array of memory cells. The multiple power control circuits provide multiple pre-charge paths configured to pre-charge the drain node of a target memory cell in the array, as well as the drain and/or source nodes of unselected memory cells in the array. The multiple pre-charge paths decrease the current through the array cells and also decrease the pre-charge and set up times for the array.

In one aspect, the multiple power control circuits can use the power supply to provide a pre-charge voltage to at least some of the nodes as opposed to the charge pump voltage. By using the power supply, the overall power consumed during programming can be reduced.

These and other features, aspects, and embodiments of the invention are described below in the section entitled "Detailed Description."

BRIEF DESCRIPTION OF THE DRAWINGS

For a more complete understanding of the invention, and the advantages thereof, reference is now made to the following descriptions taken in conjunction with the accompanying drawings, in which.

DETAILED DESCRIPTION

Figure 1:
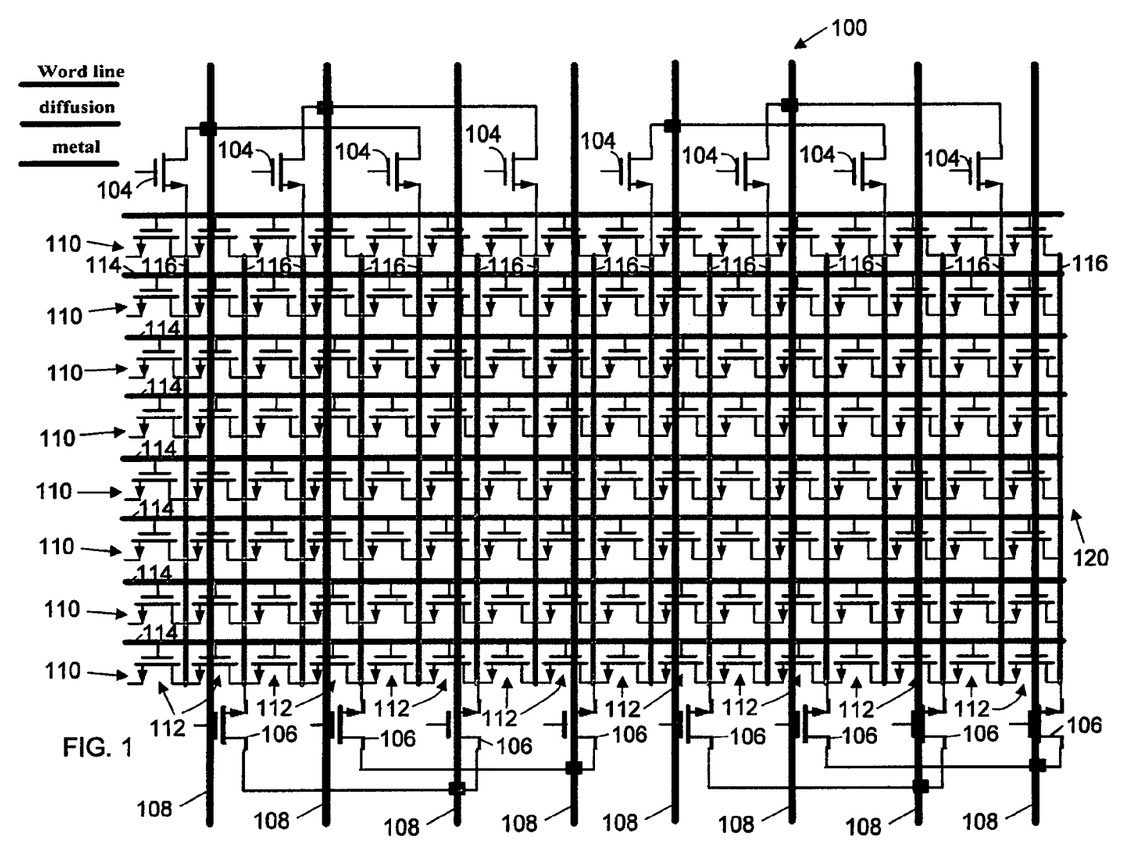
FIG. 1 is a diagram illustrating an example virtual ground memory cell array.

FIG. 1 is a diagram illustrating a conventional virtual ground array 100 of memory cells 100. Array 100 comprises metal lines 108 interfaced with bank select transistors 104 and 106. Transistors 104 and 106 can be MOS transistors and are coupled with diffusion lines 116.

Array 100 is arranged in rows 110 and columns 112 as illustrated. Diffusion lines 116 are coupled with the drain and source nodes of the transistors comprising rows 110 and columns 112. Diffusion lines 116 are coupled with the drain or source node of the transistors within a particular column 112 as illustrated. Word lines 114 are then coupled with the gates of the transistors in a particular column 112.

Figure 2:
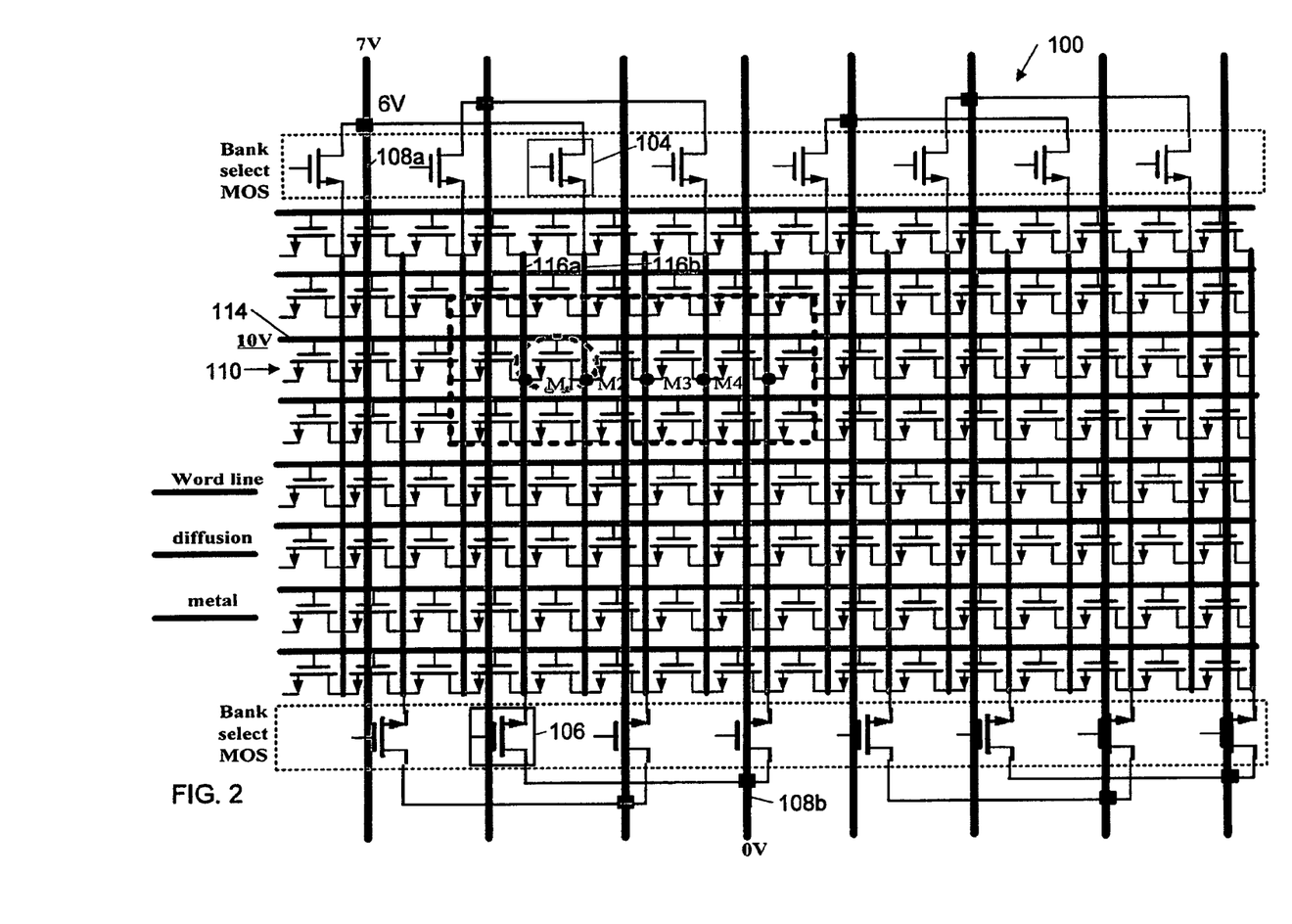
FIG. 2 is a diagram illustrating how a target cell can be selected for programming in the array of FIG. 1.

As illustrated in FIG. 2, a target cell M1 in array 100 can be programmed by applying a high voltage to a metal line 108a and turning on the associated bank select transistor 104. Bank select transistor 104 will pass the high voltage applied to metal line 108a to the associated diffusion line 116b which is coupled to the drain node of transistor M1. A high voltage can then be applied to word line 114 coupled with the gate of transistor M1. A low voltage can then be applied to metal line 108b and the appropriate bank select transistor 106 can be turned on in order to couple the low voltage to the source of the transistor M1 via diffusion line 116a.

In the example of FIG. 2, a high voltage of 6 volts is applied to the drain of transistor M1, a high voltage of 10 volts is applied to the gate of transistor M1, and a low voltage of 0 volts, or ground is applied to the source of transistor M1. It will be apparent, however, that the voltages applied will depend on the specific implementation in which array 100 is being used. Accordingly, the voltages illustrated in FIG. 2 are by way of example only and should not be seen as limiting the methods described herein to any particular voltage.

As illustrated in FIG. 2, the high voltage applied to the gate of transistor M1 via word line 114 is also applied to the gates of all transistors within the same row 110. Similarly, the high voltage applied to the drain of transistor M1 is also applied to the drain of all transistors in the same row 110. Thus, the high voltages applied to the gate and drain of transistor M1 can result in program disturb for other transistors in row 110, such as transistors M2, M3, and M4.

Figure 3A:
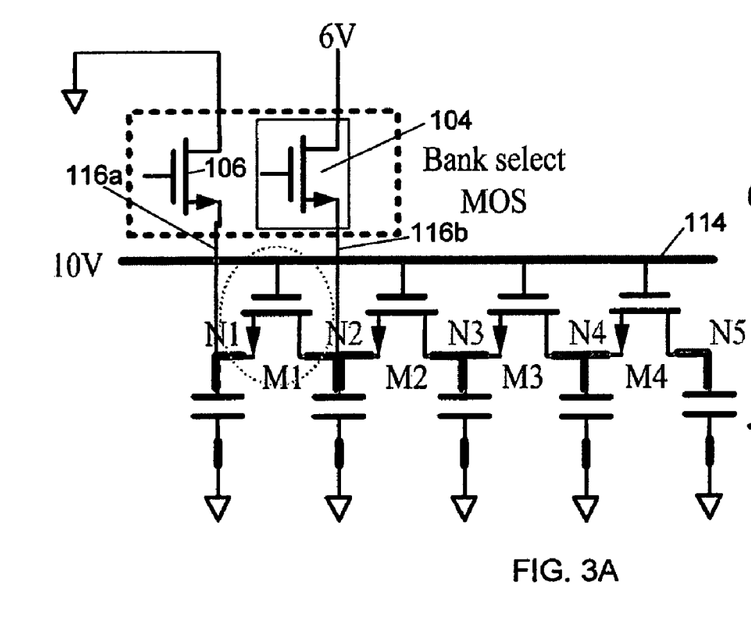
FIG. 3A is a diagram illustrating a close up view of the selected memory cell as well as several unselected cells near the selected cell that can be subject to program disturb.
Figure 3B:
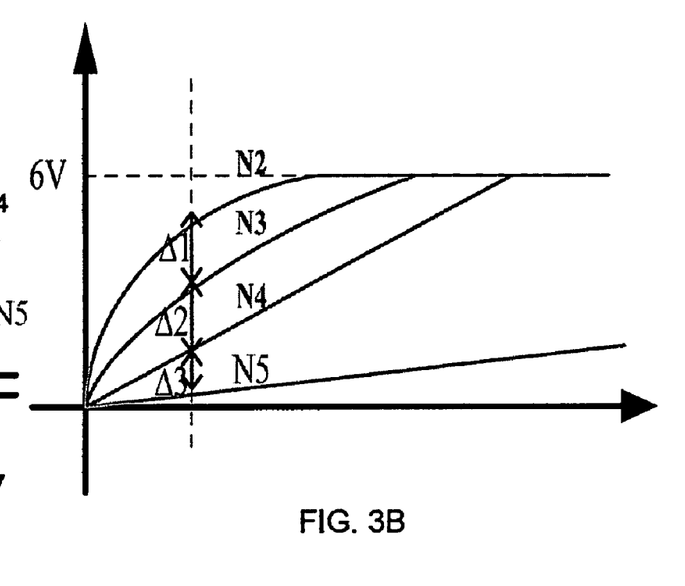
FIG. 3B is a diagram illustrating the charging of various nodes of the cells illustrated in FIG. 3B.

This can be illustrated with the aid of FIGS. 3A and 3B. FIG. 3A is a diagram illustrating a close up view of transistors M1, M2, M3, and M4. The source and drain nodes of transistors M1, M2, M3, and M4 are labeled as nodes N1, N2, N3, N4, and N5 as illustrated. As discussed above, a high voltage, e.g., 10 volts, is applied to word line 114 which is interfaced with the gates of each transistor M1, M2, M3, and M4. Node N1 is coupled to ground via diffusion line 116a and bank select transistor 106. Node N2 is coupled to a high voltage, e.g., 6 volts, via diffusion line 116b and transistor 104. This will cause the voltage on node N2 to rise to 6 volts as illustrated by curve 302 in FIG. 3B.

The voltages applied to nodes N1 and N2 as illustrated in FIG. 3A will create a large lateral electric field between the drain and source of transistor M1. This large lateral electric field will generate hot electrons that can be injected into the floating gate of transistor M1, thus changing the threshold voltage of transistor M1. As illustrated in FIG. 3B, parasitic loading within an array 100 will also cause nodes N3, N4 and N5 to charge up to the voltage level applied to N2. This is illustrated by curves 304, 305 and 306 in FIG. 3B. In other words, when node N2 is being pre-charged in order to program transistor M1, current is also flowing, due to the parasitic effects, through transistors M2, M3, and M4. This will cause transistor M2, M3, and M4 to experience a soft program effect, which results in program disturb. As mentioned above, even a minor amount of program disturb can result in invalid data in an MLC array where the program windows can be very small.

Figure 4:
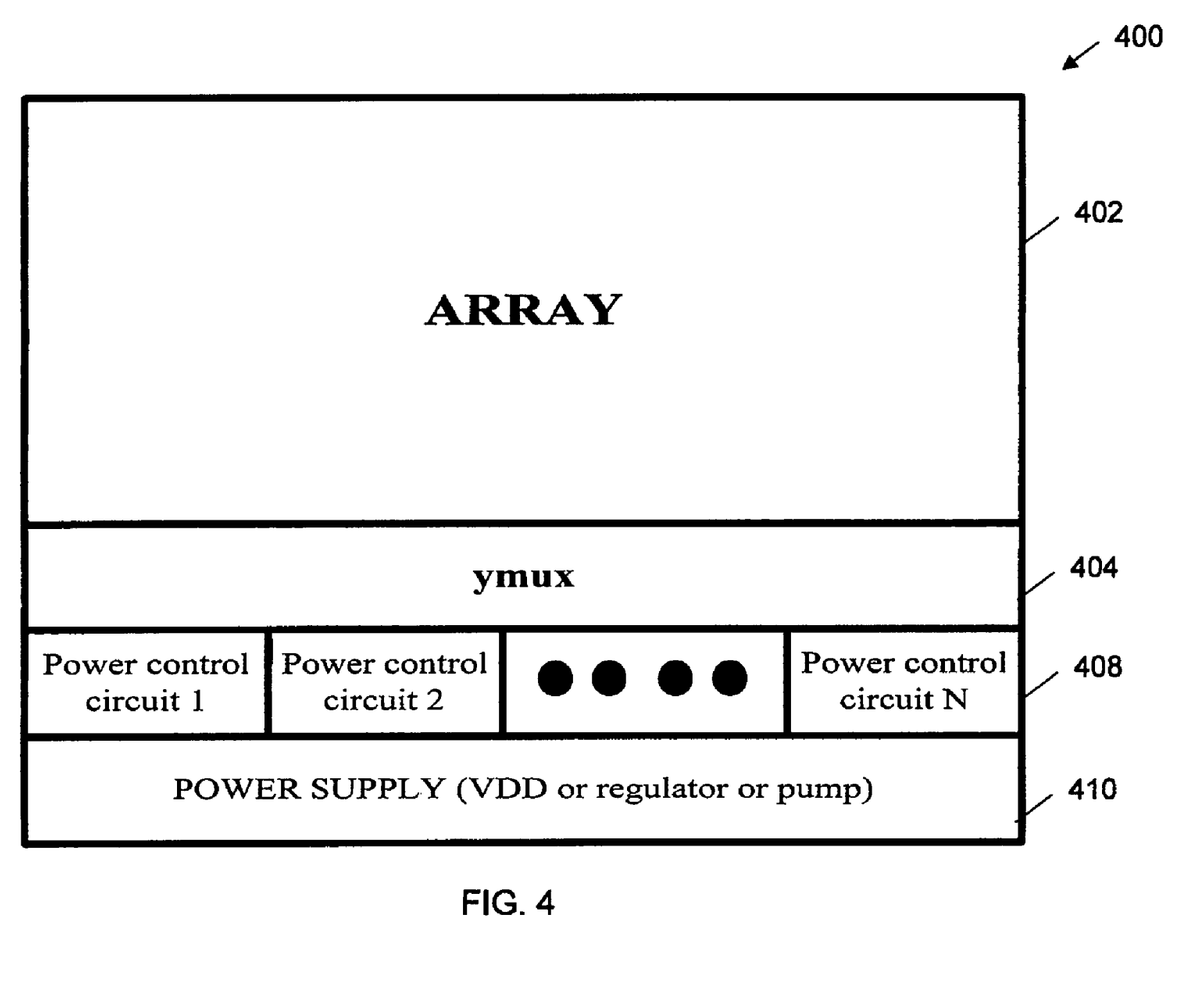
FIG. 4 is a diagram illustrating an example non-volatile memory device comprising a plurality of power control circuits in accordance with one embodiment.

FIG. 4 is a diagram illustrating a non volatile memory device 400 configured in accordance with one embodiment. Device 400 can comprise a memory array 402, which can be similar to memory array 100 illustrated in FIG. 1. Device 400 can also comprise a Y-multiplexer 404 configured to interface signals with array 402. For example, Y-multiplexer 404 can be couples with metal lines 108 and with the power control circuits 408. One power control circuit 408 will control many metal lines 108. Y-multiplexer 404 will decode which metal lines 108 are to be controlled during a given operation. For convenience, the following description will ignore the Y-multiplexer 404.

As noted, device 400 can comprise a power supply circuit 410 and a plurality of power control circuits 408 configured to interface voltage signals with the source and drain nodes of transistors in array 402. Depending on the embodiment, the plurality of power controls circuits 408 can be configured to interface a power supply signal, a regular output, a charge pump output, or some combination thereof with the nodes of the transistors comprising array 402.

By including the plurality of power control circuits 408, multiple pre-charged paths can be provided to array 402. The multiple paths can allow for lower peak currents in array 402, and therefore lower power consumption, shorter pre-charge time, and smaller average currents. In addition, power control circuits 408 can be configured to pre-charge the nodes of array 402 so as to limit, or prevent the program disturb effect.

Figure 5:
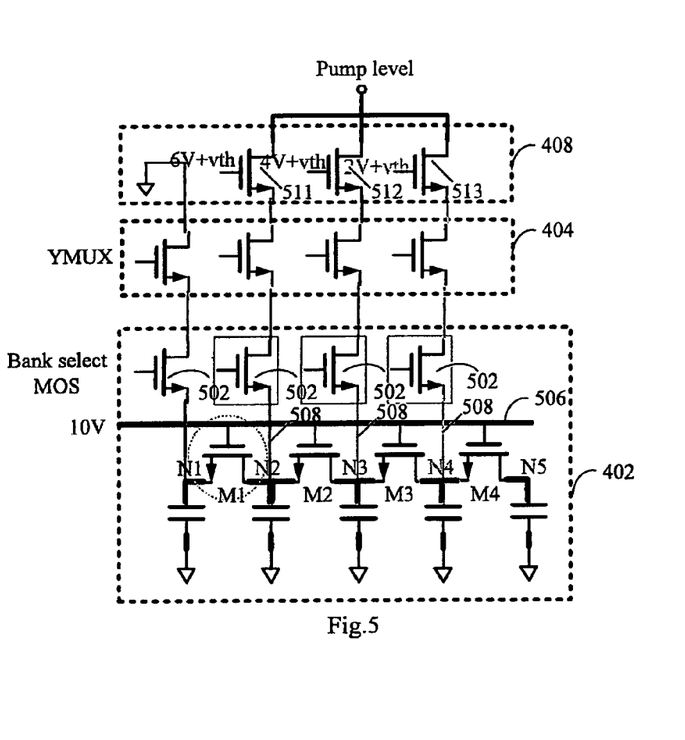
FIG. 5 is a diagram illustrating a close up view of the plurality of power control circuits included in the device of FIG. 4 in accordance with one embodiment.

FIG. 5 is a diagram illustrating a close up of transistors M1, M2, M3, and M4 which can comprise a portion of array 402. Thus, power control circuits 408 can be configured to supply voltages to the nodes of transistors M1, M2, M3, and M4 via Y-multiplexer 404 bank select transistors 502 and diffusion lines 508. In the example of FIG. 5, transistor M1 is the target cell being programmed. Accordingly, node N1 is coupled with ground. Node N2 is pre-charged to a high voltage and a high voltage can then be applied to the gate of transistor M1 via word line 506.

In addition, however, nodes N3 and N4 are also pre-charged via power control circuits 408, Y-multiplexer 404, bank select transistors 502, and diffusion lines 508. In the example of FIG. 5, node N2 is pre-charged with the programming voltage level, e.g., 6 volts. Actually, the programming voltage level used to pre-charge node N2 is generated by applying about (6V+Vth) to the gate of the associated NMOS transistor 511 of power control circuit 408, where Vth is about a threshold voltage associated with transistor 511. Nodes N3 and N4 are pre-charged with different voltage levels. The pre-charged voltage levels for nodes N3 and N4 can be referred to as shielding levels.

In the example of FIG. 5, and FIGS. 6, 9, and 10 described below, the NMOS transistors, e.g., transistors 511-513, are configured in what is commonly referred to as a source follower configuration. In other words, the voltage on the source node will follow the voltage on the gate. Of course, as noted, the transistor threshold voltage, as well as transistor current and body effects must be taken into consideration.

Accordingly, depending on the embodiment, node N3 can be pre-charged with a first shielding level, which can be generated by applying, e.g., about (4V+Vth) to the gate of the associated NMOS transistor 512 of power control circuit 408. The associated NMOS transistor 512 can control the N3 initial pre-charge voltage. After N3 reaches around 4V this pre-charge path closes, because NMOS transistor 512 will turn off; however, N3 is still pre-charged by NMOS transistor 511 via a power path through memory cell M2.

Node N4 can be pre-charged with a second shielding level, which generated by applying, e.g., about (2V+Vth) to the gate of the associated NMOS transistor 513 of power control circuit 408. Transistor 513 can control the N4 initial pre-charge voltage. After N4 reaches around 2V, this pre-charge path with close, because NMOS transistor 513 will turn off; however, N4 is still pre-charged by NMOS 511 via a power path through memory cells M2 and M3.

In the example of FIG. 5, the first shielding level is about 4 volts and the second shielding level is about 2 volts; however, N3, N4 and N5 will also pre-charged to 6 volts if the pre-charge time is long enough. It will be understood that the voltages illustrated in FIG. 5 are by way of example only and that the actual programming and shield voltage levels used will depend on the specific implementation.

Pre-charging nodes N3 and N4 reduces the beginning and maximum lateral electric field created in transistors M2, M3, and M4 and thereby reduces the current flowing in these transistors. This can help reduce the program disturb effect described above. Further, the pre-charge time for the array is decreased and less current flows through the array due to the multiple pre-charged paths. This also reduces the overall pre-charged current, compared to devices in which the entire parasitic array loading must be pre-charged. Accordingly, array 402 can be programmed quicker, with less power consumption, and without disturbing the programming of un-selected cells.

It should be noted while three pre-charged paths are illustrated in the example of FIG. 5, and in FIG. 6 discussed below, more or less paths can be included depending on the embodiment. Including more paths can actually increase the flexibility of the design in order to further limit program disturb, further speed up the pre-charge set up time, and therefore the overall programming time, and/or further reduce the power consumption during programming. It will be understood that the number of pre-charged paths included will depend on the requirements of the specific implementation.

Figure 7A:
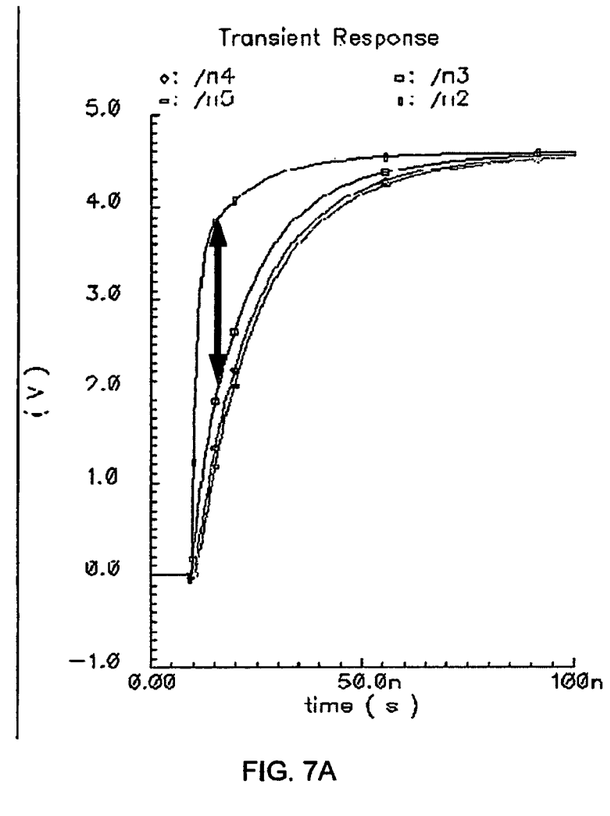
FIGS. 7A to 7C are diagrams illustrating the program disturb effect that can occur in a conventional array such as that illustrated in FIG. 1.
Figures 7B, 7C:
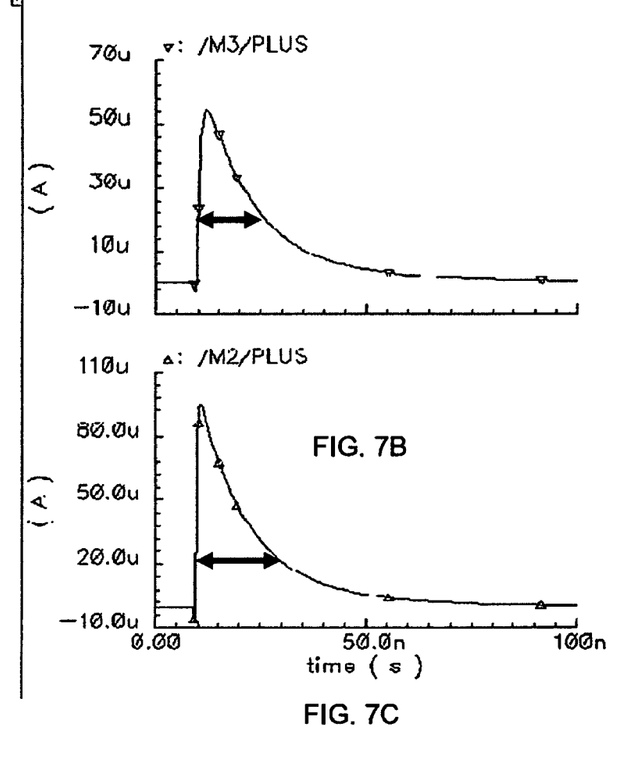

FIG. 7B and 7C are graphs illustrating the current through transistors M3 and M2, respectively, in a conventional array such as that illustrated in FIG. 3A. As can be seen, the peak currents for transistors M3 and M2 are relatively high during the pre-charge phase. Further, the peak lasts for a relatively long time which produces a relatively large average current through transistors M3 and M2. FIG. 7A illustrates the charging of nodes N2, N3, N4, and N5. As can be seen, node N2 charges up fairly quickly while nodes N3, N4, and N5 charge up slower, which produces a larger difference in the voltage levels of nodes N3, N4, and N5 relative to node N2. These large voltage differences can produce large lateral electric fields, which can produce the currents illustrated in FIGS. 7B and 7C.

Figure 8A:
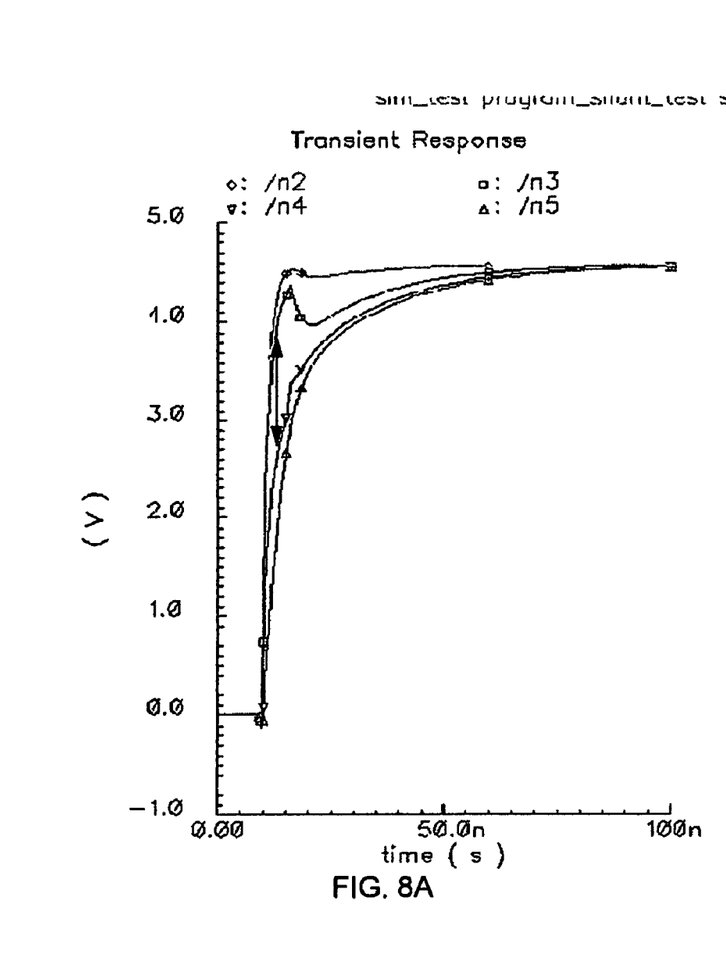
FIGS. 8A to 8C are diagrams illustrating how the plurality of power control circuits included in the device of FIG. 4 can mitigate program disturb effect.
Figure 8B:
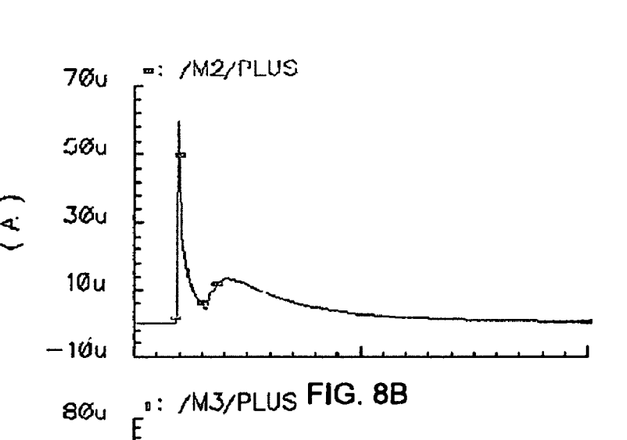
Figure 8C:
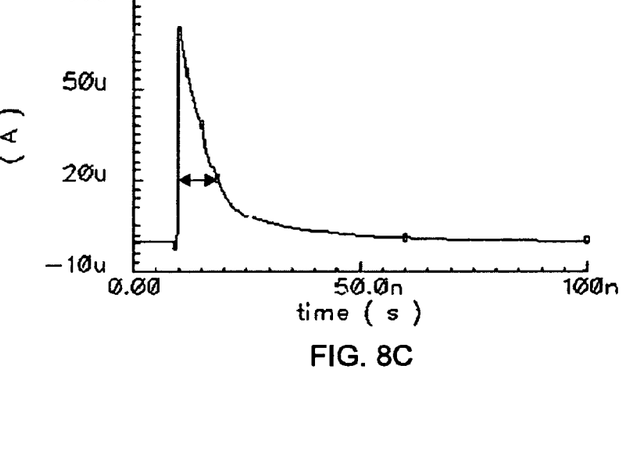

Conversely, FIGS. 8A through 8C are diagrams illustrating the voltages and currents for the array illustrated in FIG. 5. FIGS. 8B and 8C illustrate the current through transistors M2 and M3, respectively, during the pre-charged period. FIG. 8A illustrates the pre-charging of nodes N2, N3, N4, and N5. As can be seen in FIGS. 8B and 8C, transistors M2 and M3 experience reduced peak currents for shorter periods of time, which result in smaller average currents through transistors M2 and M3. FIG. 8A illustrates that the voltage difference between node N2 and nodes N3, N4, and N5 is reduced, which can reduce the lateral electric field generated in transistors M2, M3, and M4. The reduced lateral electric fields and lower average currents can reduce the program disturb effect described above.

The pre-charged speed and resulting program disturb effect can be tuned by tuning the shielding voltage levels applied to the various nodes in array 402. For example, in FIG. 6 both node N2 and node N3 are pre-charged with the same level, and node N4 is pre-charged with a shielding level that is half of the shielding level applied to node N3. In certain embodiments, the arrangement of FIG. 6 can result in faster pre-charge setup time.

Figure 6:
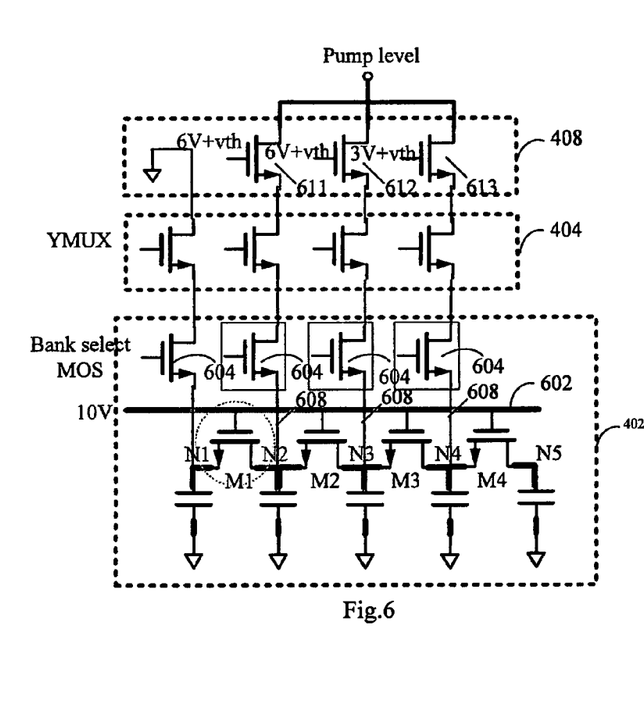
FIG. 6 is a diagram illustrating a close up view of the plurality of power control circuits included in the device of FIG. 4 configured in accordance with another embodiment.
Figure 9:
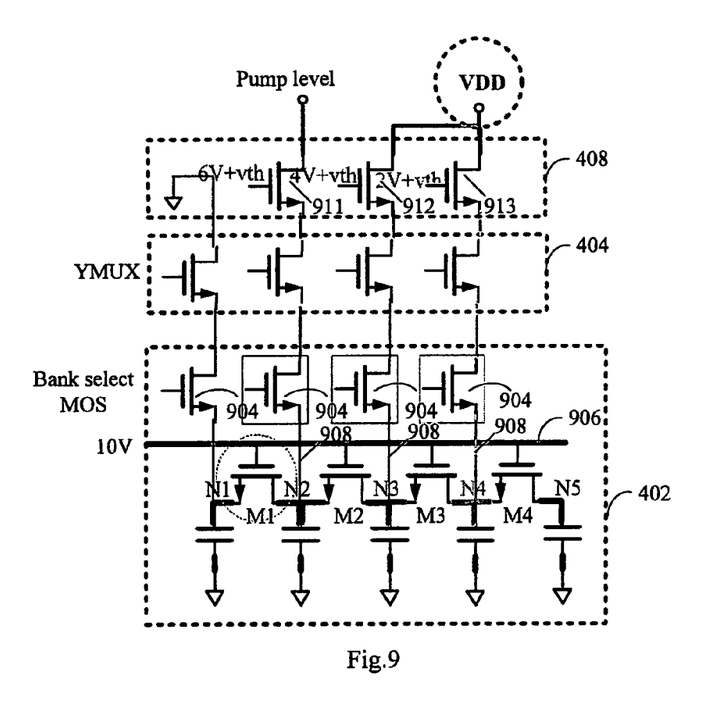
FIG. 9 is a diagram illustrating a close up view of the plurality of power control circuits included in the device of FIG. 4 configured in accordance with still another embodiment.
Figure 10:
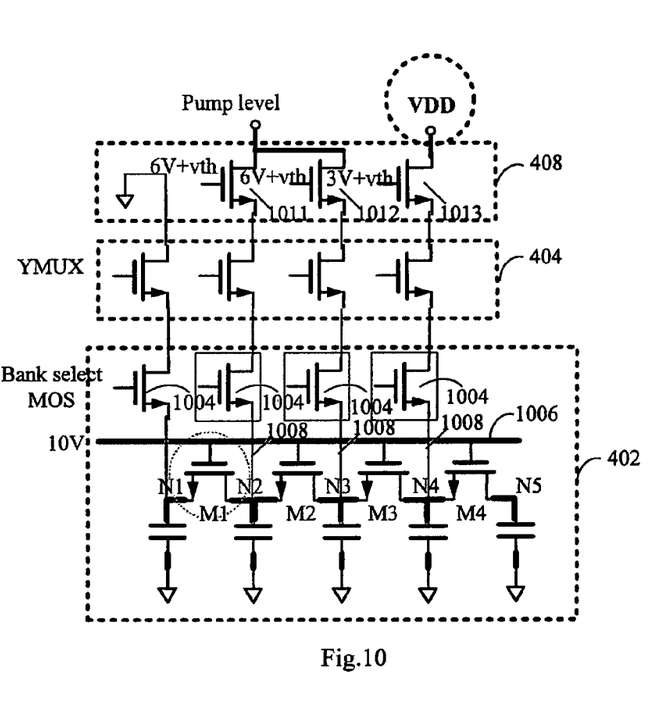
FIG. 10 is a diagram illustrating a close up view of the plurality of power control circuits included in the device of FIG. 4 configured in accordance with still another embodiment.

The embodiments illustrated in FIGS. 5 and 6 supply programming and shielding voltages based on the charge pump power source. Further reductions in power consumption can be achieved by applying the power source (VDD) to one or more of the nodes during pre-charging. FIGS. 9 and 10 illustrate embodiments in which VDD is used for some of the nodes during pre-charging. In FIG. 9, node N3 and N4 are charged with a shielding level, in this example about 2 and 4 volts, by controlling the gate voltage of NMOS transistors 912 and 913, respectively. This lower shielding level is supplied from VDD as illustrated. Nodes N2 is pre-charged using the charge pump level as with the embodiments of FIGS. 5 and 6.

In FIG. 10, node N4 is pre-charged to shielding levels using VDD. Thus, the power dissipated within array 402, in the example of FIG. 9, will be even less than that for the embodiment of FIG. 10. By using VDD as a power source for at least some of the nodes, the power dissipation can be reduced by as much as a third during pre-charging.

Accordingly, by implementing the methods described above in non-volatile memory devices, programming time, power consumption, and program disturb can all be reduced. The methods described above can be applied in any non-volatile memory device including Flash memory devices, MLC Flash memory devices, multiple times program (MTP) memory devices, and one time program (OTP) memory devices. Accordingly, the embodiments described above should not be seen as limiting the methods and apparatus described herein to any particular type of non volatile memory device.

While certain embodiments of the inventions have been described above, it will be understood that the embodiments described are by way of example only. For example, while p-type substrates and n-type drain and source regions are shown, it will be understood that other embodiments may use n-type substrates with p-type drain and source regions. Further, non-volatile memory devices configured in accordance with the systems and methods described herein can be single well or multiple well devices depending on the embodiment. Accordingly, the inventions should not be limited based on the described embodiments. Rather, the scope of the inventions described herein should only be limited in light of the claims that follow when taken in conjunction with the above description and accompanying drawings.

What is claimed is:

1. A method for programming a target memory cell in a memory cell array, comprising:
   pre-charging a drain node of the target memory cell to a programming voltage;
   pre-charging a first adjacent node in the array to a first initial shielding voltage;
   pre-charging a second adjacent node in the array to a second initial shielding voltage;
   applying a low voltage to a source node of the target cell; and
   applying a high voltage to a gate node of the target cell,
   wherein the programming voltage and first initial shielding voltage are non-zero voltages, and
   wherein pre-charging the second adjacent node comprises controlling a gate bias of a source follower transistor, wherein the source of the source follower transistor is connected with the second adjacent node.

2. The method of claim 1, wherein the first initial shielding voltage is equal to the programming voltage.

3. The method of claim 1, wherein the first initial shielding voltage is less than the programming voltage.

4. The method of claim 1, wherein the first initial shielding voltage is higher than the programming voltage.

5. The method of claim 1, wherein the programming voltage and the first initial shielding voltage are the same, and wherein the second initial shielding voltage is less than the programming voltage and the first initial shielding voltage.

6. The method of claim 1, wherein the first initial shielding voltage is less than the programming voltage, and wherein the second initial shielding voltage is less than the first initial shielding voltage.

7. The method of claim 1, further comprising generating the programming voltage and the first initial shielding voltage from a charge pump.

8. The method of claim 1, further comprising generating the first initial shielding voltage and the second initial shielding voltage from a power supply.

9. The method of claim 1, further comprising generating the programming voltage and the first initial shielding voltage from a voltage regulator.

10. A method for reducing program disturb of a target memory cell in a memory cell array, comprising:
    supplying a program voltage to a drain node of the target memory cell;
    supplying a plurality of different initial shielding voltages to neighboring source/drain nodes in the memory cell array;
    supplying a low voltage to a source node of the target memory cell; and
    supplying a high voltage to a gate node of the target memory cell,
    wherein the program voltage and each of the plurality of initial shielding voltages are non-zero voltages.

11. The method of claim 10, wherein a first one of the plurality of initial shielding voltages is one of equal to the program voltage, less than the program voltage, and higher than the program voltage.

12. The method of claim 10, wherein the supplying a plurality of initial shielding voltages includes controlling a gate bias of a source follower transistor.

13. The method of claim 12, wherein the source of the source follower transistor is connected with one of the adjacent nodes.

14. The method of claim 13, wherein the program voltage and a first one of the plurality of initial shielding voltages are the same, and a second one of the plurality of initial shielding voltages is less than the program voltage and the first one of the plurality of initial shielding voltages.

15. The method of claim 13, wherein a first one of the plurality of initial shielding voltages is less than the program voltage, and a second one of the plurality of initial shielding voltages is less than the first one of the plurality of initial shielding voltages.

16. The method of claim 10, further comprising generating the program voltage and a first one of the plurality of initial shielding voltages from a charge pump.

17. The method of claim 10, further comprising generating the plurality of initial shielding voltages from a power supply.

18. The method of claim 10, further comprising generating the program voltage and a first one of the plurality of initial shielding voltages from a voltage regulator.

* * * * *